(12) United States Patent
Sato et al.

(10) Patent No.: US 9,429,849 B2
(45) Date of Patent: Aug. 30, 2016

(54) ADJUSTING METHOD OF PATTERN TRANSFERRING PLATE, LASER APPLICATION MACHINE AND PATTERN TRANSFERRING PLATE

(71) Applicant: Kabushiki Kaisha Toshiba, Minato-ku (JP)

(72) Inventors: Hidenori Sato, Yokohama (JP); Nobuhiro Komine, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 148 days.

(21) Appl. No.: 14/296,866

(22) Filed: Jun. 5, 2014

(65) Prior Publication Data

US 2015/0253676 A1  Sep. 10, 2015

Related U.S. Application Data

(60) Provisional application No. 61/949,677, filed on Mar. 7, 2014.

(51) Int. Cl.
*G03B 27/68* (2006.01)
*G03F 7/20* (2006.01)
*G03F 7/00* (2006.01)

(52) U.S. Cl.
CPC ....... *G03F 7/70191* (2013.01); *G03F 7/70558* (2013.01); *G03F 7/0002* (2013.01)

(58) Field of Classification Search
CPC .................................................. G03F 7/70191
See application file for complete search history.

(56) References Cited

U.S. PATENT DOCUMENTS

| 5,671,054 A * | 9/1997 | Iwasaki ............... G03F 7/70483 250/559.29 |
| 7,001,697 B2 * | 2/2006 | Park .................... G02B 5/1871 430/5 |
| 7,241,539 B2 | 7/2007 | Kim et al. |
| 7,604,927 B2 | 10/2009 | Kim et al. |
| 7,605,906 B2 | 10/2009 | Kim et al. |
| 7,745,072 B2 * | 6/2010 | Jung ........................ G03F 1/72 216/12 |
| 7,904,851 B2 | 3/2011 | Itoh et al. |
| 8,232,029 B2 * | 7/2012 | Lee ........................... G03F 1/54 430/30 |
| 8,407,628 B2 | 3/2013 | Itoh et al. |
| 8,584,054 B2 | 11/2013 | Itoh et al. |
| 8,966,409 B2 * | 2/2015 | He ...................... G06F 17/5068 430/30 |
| 2001/0019407 A1 * | 9/2001 | Sato .................... G01N 21/956 356/237.4 |

(Continued)

FOREIGN PATENT DOCUMENTS

| JP | 2005-157375 | 6/2005 |
| JP | 2008-26822 | 2/2008 |

(Continued)

OTHER PUBLICATIONS

Ute Buttgereit et al., "CD Uniformity correction on 45nm technology Non Volatile Memory", PROC SPIE 7638, 2010, 9 pages.

(Continued)

*Primary Examiner* — Deoram Persaud
(74) *Attorney, Agent, or Firm* — Oblon, McClelland, Maier & Neustadt, L.L.P

(57) ABSTRACT

According to one embodiment, a parameter for laser irradiation is adjusted in correspondence with thickness distribution of a substrate of a pattern transferring plate in which a pattern is formed on the substrate to form an altered portion within the substrate.

20 Claims, 6 Drawing Sheets

(56) References Cited

U.S. PATENT DOCUMENTS

| | | | |
|---|---|---|---|
| 2003/0157415 A1* | 8/2003 | Ziger | G03F 7/70625 430/5 |
| 2005/0136341 A1* | 6/2005 | Park | G03F 1/144 430/5 |
| 2007/0224522 A1* | 9/2007 | Lee | G03F 1/14 430/5 |
| 2007/0273852 A1* | 11/2007 | Arai | G03F 7/7005 355/44 |
| 2010/0003830 A1* | 1/2010 | Itoh | B29C 35/0894 438/758 |
| 2012/0099089 A1* | 4/2012 | Sogard | G03F 1/84 355/52 |
| 2015/0116687 A1* | 4/2015 | Yoneda | G03F 7/70775 355/72 |

FOREIGN PATENT DOCUMENTS

| | | |
|---|---|---|
| JP | 2010-44287 | 2/2010 |
| JP | 2010-152031 | 7/2010 |

OTHER PUBLICATIONS

Anka Birnstein et al., "Multiple Layer CD Control Treatment", Proceedings of the SPIE, vol. 7274, 2009, 12 pages.

Avi Cohen et al., "Correcting Image Placement Errors Using Registration Control (RegC) Technology in the Photomask Periphery", Proc. Of SPIE 2012, 9 pages.

Erez Graitzer et al "Closed Loop Registration Control (RegC) Using PROVE as the Data Source for the RegC Process", Proc. Of SPIE, vol. 8441, 2012, 9 pages.

* cited by examiner

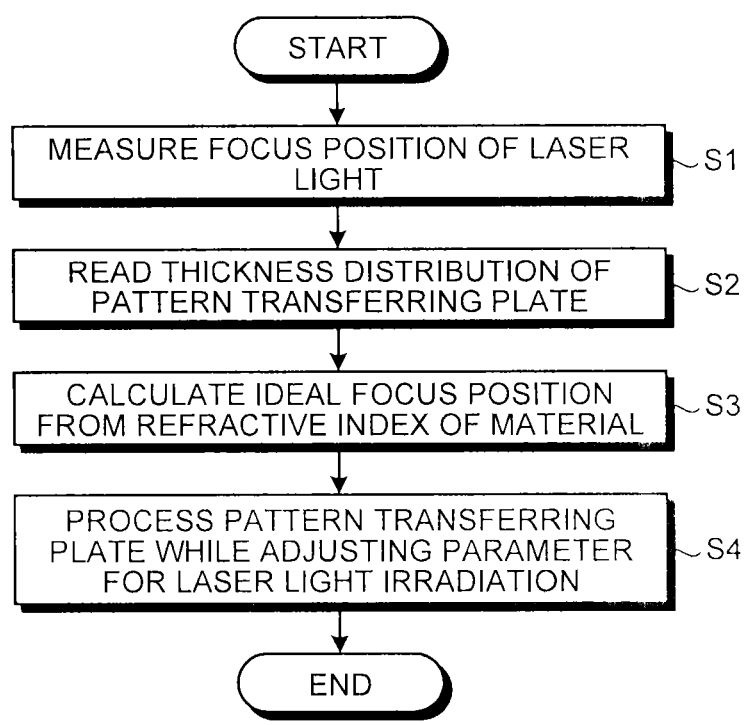

ADJUSTING METHOD OF PATTERN TRANSFERRING PLATE, LASER APPLICATION MACHINE AND PATTERN TRANSFERRING PLATE

CROSS-REFERENCE TO RELATED APPLICATIONS

This application is based upon and claims the benefit of priority from Provisional Patent Application No. 61/949,677, filed on Mar. 7, 2014; the entire contents of which are incorporated herein by reference.

FIELD

Embodiments described herein relate generally to an adjusting method of pattern transferring plate, a laser application machine, and a pattern transferring plate.

BACKGROUND

In a process for manufacturing a semiconductor device including a large number of various semiconductor elements such as transistors, fine-line patterning techniques are essential to increase integration degree. In these days, the development of various lithographic techniques has been enthusiastically advanced for further finer patterns. One of issues in lithographic technology is improvement of photomask accuracy.

To improve the photomask accuracy, the interior of glass of a photomask is irradiated with a femtosecond laser to alter the quality of the glass, thereby correcting the dimension accuracy, position accuracy, and flatness of the photomask.

BRIEF DESCRIPTION OF THE DRAWINGS

FIG. 6 is a flowchart of an adjusting method of a pattern transferring plate according to the first embodiment.

DETAILED DESCRIPTION

In general, according to one embodiment, a parameter for laser irradiation is adjusted in correspondence with the thickness distribution of a substrate of a pattern transferring plate in which a pattern is formed on the substrate, thereby to form an altered portion in the substrate.

Exemplary embodiments of an adjusting method of a pattern transferring plate, a laser application machine, and a pattern transferring plate will be explained below in detail with reference to the accompanying drawings. The present invention is not limited to the following embodiments.

Figure 1:
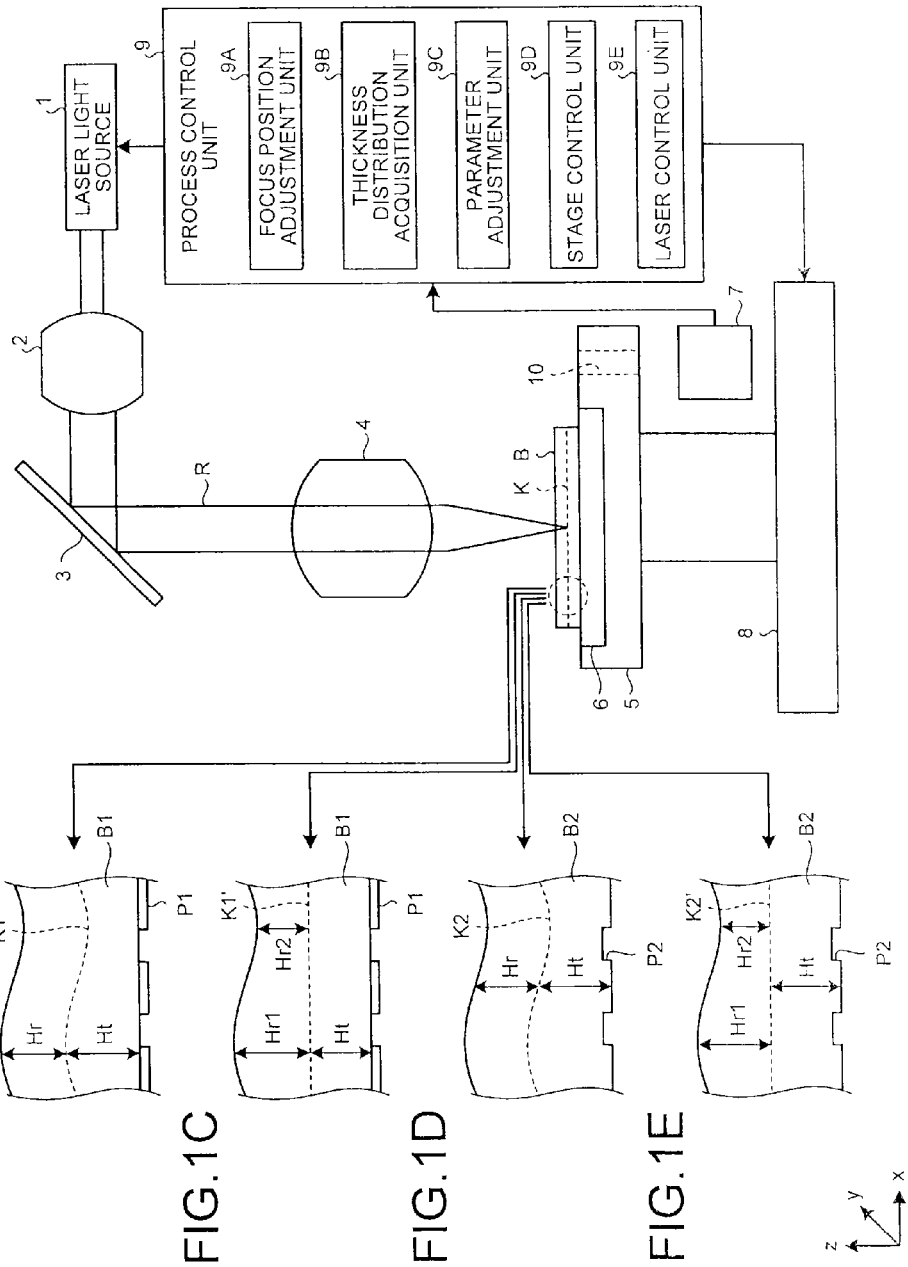
FIG. 1A is a schematic block diagram of a laser application machine according to a first embodiment.
FIGS. 1B and 1C are partially enlarged cross-sectional views of a pattern transferring plate B as a photomask illustrated in FIG. 1A, and FIGS. 1D and 1E are partially enlarged cross-sectional views of the pattern transferring plate B as a template illustrated in FIG. 1A.

FIG. 1A is a schematic block diagram of a laser application machine according to a first embodiment, FIGS. 1B and 1C are partially enlarged cross-sectional views of a pattern transferring plate B as a photomask illustrated in FIG. 1A, and FIGS. 1D and 1E are partially enlarged cross-sectional views of the pattern transferring plate B as a template illustrated in FIG. 1A.

FIGS. 1B and 1D illustrate the case where the height distributions of altered portions K1 and K2 in substrates B1 and B2 are set in correspondence with the thickness distributions of the substrates B1 and B2. FIGS. 1C and 1E illustrate the case where the internal stress distributions of altered portions K1' and K2' in the substrates B1 and B2 are set in correspondence with the thickness distributions of the substrates B1 and B2.

Referring to FIG. 1A, a laser application machine is provided with a laser light source 1, an illumination optical system 2, a reflective mirror 3, a reduced projection optical system 4, a stage 5, a light-receiving unit 7, a stage drive unit 8, and a process control unit 9. The stage 5 is provided with a transferring plate chuck unit 6 and an opening 10. The opening 10 can be arranged around the transferring plate chuck unit 6. The stage 5 may have a plurality of openings 10. The light-receiving unit 7 can be arranged immediately below the opening 10.

The laser light source 1 is capable of generating laser light R. The laser light R may be a femtosecond laser pulse with a wavelength of 700 to 800 nm, for example. The illumination optical system 2 is capable of extending the diameter of the laser light R. The reflective mirror 3 is capable of changing the traveling direction of the laser light R. The reduced projection optical system 4 is capable of collecting the laser light R. The reduced projection optical system 4 may be provided with an object lens. The stage 5 is capable of holding a pattern transferring plate B. The pattern transferring plate B may be a photomask or a template for nanoimprint. The transferring plate chuck unit 6 is capable of fixing the pattern transferring plate B on the stage 5. The stage drive unit 8 is capable of moving the stage 5 in a horizontal direction (x direction and y direction) and a height direction (z direction). The process control unit 9 is capable of controlling processing of the pattern transferring plate B by laser irradiation.

The process control unit 9 is provided with a focus position adjustment unit 9A, a thickness distribution acquisition unit 9B, a parameter adjustment unit 9C, a stage control unit 9D, and a laser control unit 9E. The focus position adjustment unit 9A is capable of adjusting the focus position of laser. The thickness distribution acquisition unit 9B is capable of acquiring the thickness distribution of the substrate of the pattern transferring plate B. To acquire the thickness distribution of the substrate of the pattern transferring plate B, the laser application machine may be provided with a memory for storing data on the thickness distribution of the substrate of the pattern transferring plate B. The parameter adjustment unit 9C is capable of adjusting a parameter for laser irradiation in correspondence with the thickness distribution of the substrate of the pattern transferring plate B. The parameter for laser irradiation may be the focus height of laser irradiation, laser intensity, or laser irradiation time. The stage control unit 9D is capable of controlling movement of the stage 5 in the xyz directions based on the parameter adjusted by the parameter adjustment unit 9C. The laser control unit 9E is capable of controlling laser irradiation within the substrate of the pattern transferring plate B based on the parameter adjusted by the parameter adjustment unit 9C.

In addition, the focus position adjustment unit 9A adjusts the focus position of the laser light R prior to processing of the pattern transferring plate B. At that time, the stage 5 is moved in the horizontal direction such that the laser light R can enter the light-receiving unit 7 through the opening 10.

Figure 2:
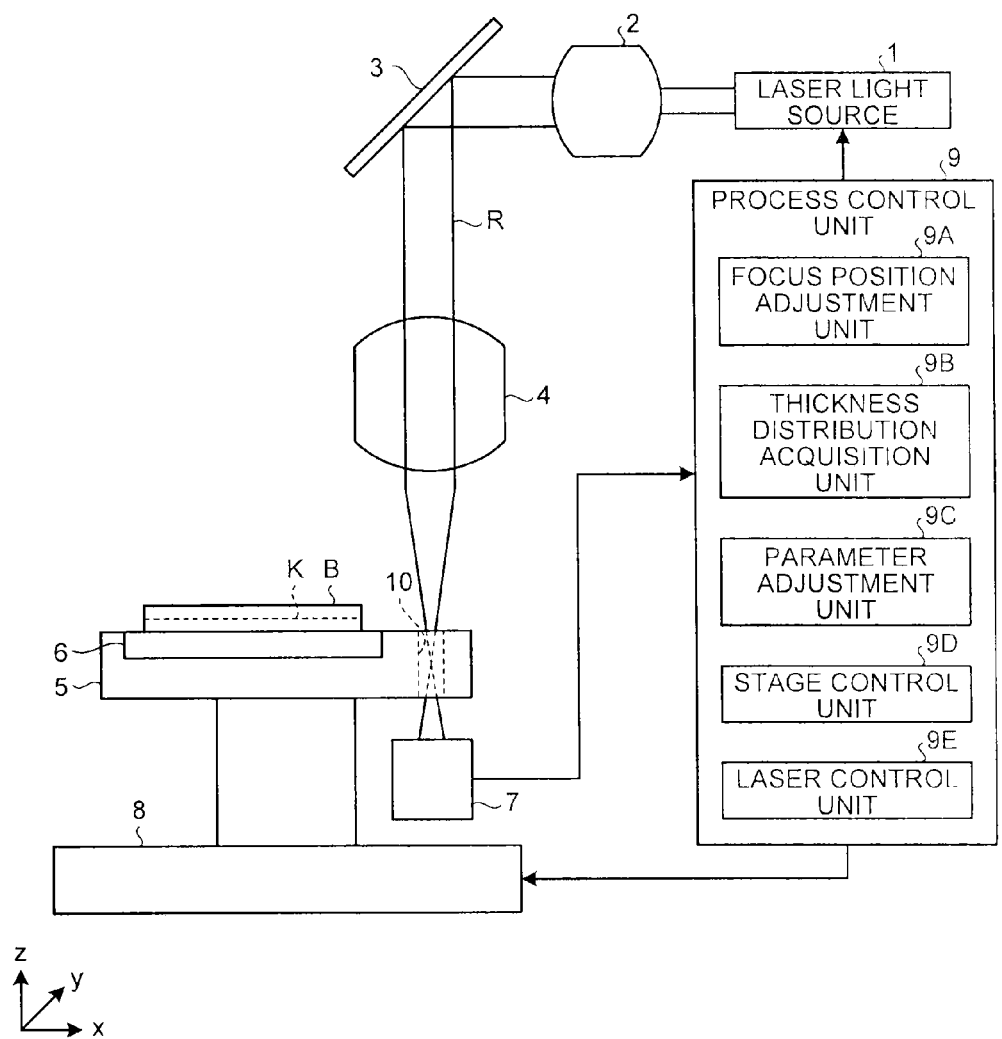
FIG. 2 is a block diagram illustrating the state in which the laser application machine according to the first embodiment is under focus position adjustment.
Figure 3:
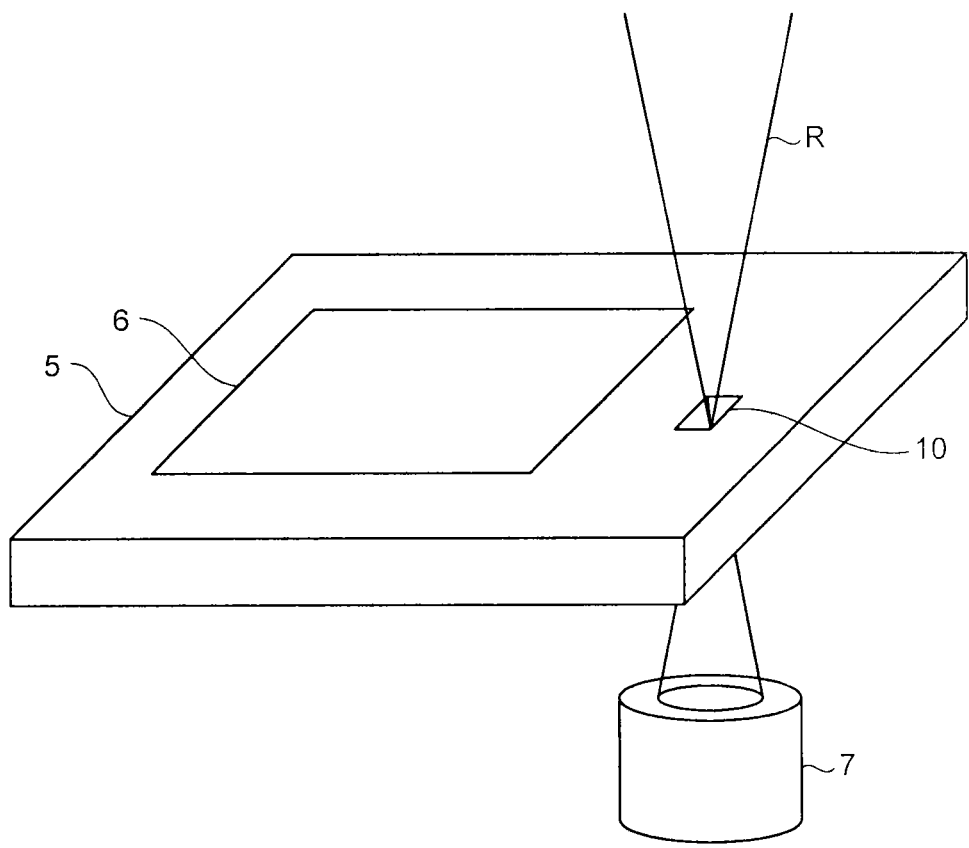
FIG. 3 is a perspective view illustrating the state of a stage in the laser application machine illustrated in FIG. 2 under focus position adjustment.

FIG. 2 is a block diagram illustrating the state in which the laser application machine according to the first embodiment is under focus position adjustment, and FIG. 3 is a perspective view illustrating the state of a stage in the laser application machine illustrated in FIG. 2 under focus position adjustment.

Figure 4:
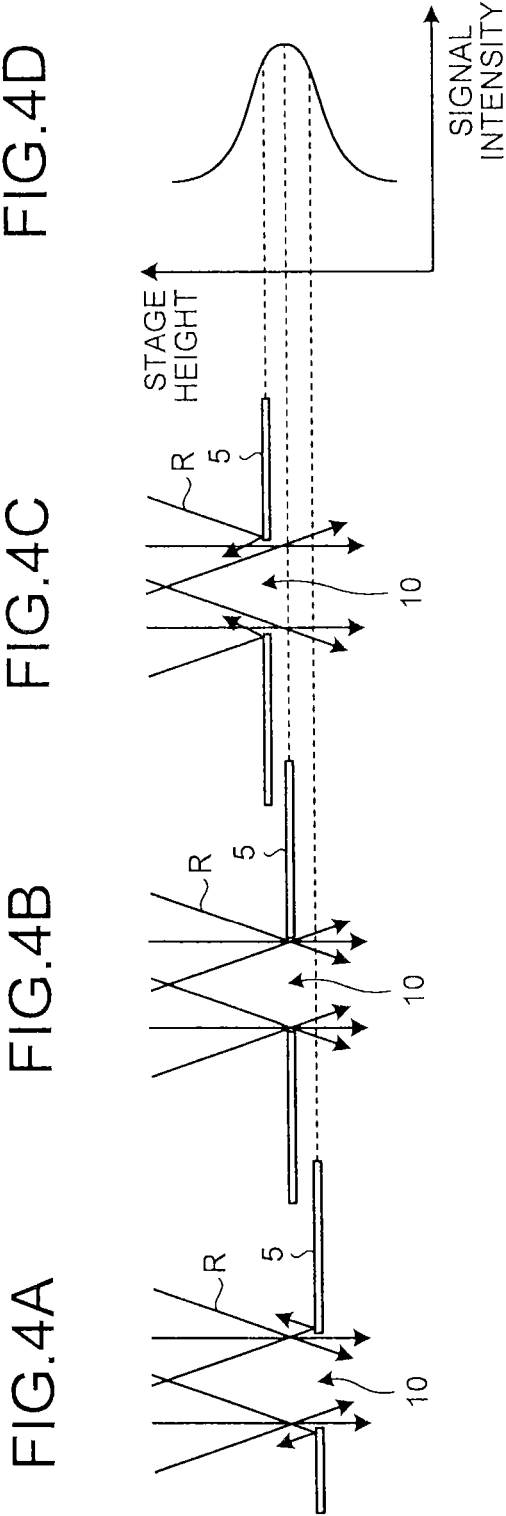
FIGS. 4A and 4C are cross-sectional views illustrating the relationship between laser light at a defocus position and an opening 10 in the laser application machine under focus position adjustment.
FIG. 4B is a cross-sectional view illustrating the relationship between laser light at a best focus position and the opening 10 in the laser application machine under focus position adjustment.
FIG. 4D is a diagram illustrating the relationship between signal intensity and stage height.

Referring to FIG. 2, when the stage 5 is moved by the stage drive unit 8, the opening 10 and the light-receiving unit 7 are moved to a position of irradiation with the laser light R. At that time, the stage 5 can be moved in the xy directions such that a laser beam axis falls at the center of the opening 10. Then, the laser light R emitted from the laser light source 1 enters the light-receiving unit 7 through in sequence the illumination optical system 2, the reflective mirror 3, the reduced projection optical system 4, and the opening 10. At that time, as illustrated in FIGS. 4A to 4C, when the stage 5 is moved up and down in the height direction, the repelled amount of the laser light R fluctuates at the opening 10, and the signal intensity at the light-receiving unit 7 changes as illustrated in FIG. 4D. That is, when the laser light R is focused on the stage 5, most of the laser light R passes through the opening 10 and enters the light-receiving unit 7, as illustrated in FIG. 4B. In contrast to this, when the laser light R is defocused, a part of the laser light R is blocked and thus the amount of light irradiated to the light-receiving unit 7 decreases, as illustrated in FIGS. 4A and 4C. Accordingly, by setting the height (z coordinate) of the stage 5 with the maximum signal intensity at the light-receiving unit 7 as a best focus position, it is possible to measure a focus height Hfa of the laser light R.

When the focus position adjustment unit 9A adjusts the focus position of the laser light R, the transferring plate chuck unit 6 places the pattern transferring plate B on the stage 5 and fixes the same to the stage 5. Then, after the thickness distribution acquisition unit 9B acquires the thickness distribution of the substrate of the pattern transferring plate B, the parameter adjustment unit 9C adjusts the parameter for laser irradiation in correspondence with the thickness distribution of the substrate of the pattern transferring plate B. Then, while the stage control unit 9D controls the movement of the stage 5 in the xyz directions based on the parameter adjusted by the parameter adjustment unit 9C, the laser control unit 9E controls laser irradiation within the substrate of the pattern transferring plate B. As a result, an altered portion K is formed within the substrate of the pattern transferring plate B in correspondence with the thickness distribution of the substrate of the pattern transferring plate B. The altered portion K can be formed in the shape of a cylindrical column in correspondence with the spot shape of the laser light R. The altered portion K can be locally changed in transmission rate or distortion amount within the substrate of the pattern transferring plate B. By changing locally the transmission rate within the substrate of the pattern transferring plate B, it is possible to change the dimensions of a pattern formed on the pattern transferring plate B. In addition, by locally changing the distortion amount within the substrate of the pattern transferring plate 13, it is possible to locally change stress within the substrate of the pattern transferring plate B, and change the position of the pattern formed on the pattern transferring plate B. Accordingly, by locally forming the altered portion K within the substrate of the pattern transferring plate B, it is possible to improve the dimension accuracy and position accuracy of the pattern on the pattern transferring plate B.

In addition, the altered portion K allows setting of the height distribution within the substrate of the pattern transferring plate B in correspondence with the thickness distribution of the substrate of the pattern transferring plate B. Alternatively, laser intensity or laser irradiation time may be controlled such that the amount of attenuation by the substrate of the pattern transferring plate B is unified according to the thickness distribution of the substrate of the pattern transferring plate B.

For example, it is assumed that the pattern transferring plate B is a photomask. In the photomask, a mask pattern P1 is formed on the substrate B1 as illustrated in FIG. 1B. The mask pattern P1 may be formed by a light-blocking pattern of Cr or the like. The substrate B1 may be a transparent substrate of quartz, glass, or the like. The laser light R emitted from the laser light source 1 enters the substrate B1 through in sequence the illumination optical system 2, the reflective mirror 3, and the reduced projection optical system 4, thereby to locally form the altered portion K1 within the substrate B1. At that time, when the stage 5 is moved up and down in the z direction according to the thickness distribution of the substrate B1, a height position Ht of the altered portion K1 is controlled in correspondence with the thickness distribution of the substrate B1. At that time, the height position Ht of the altered portion K1 can be set such that a distance Hr from a back surface of the substrate B1 to the altered portion K1 is constant. Thus, even with the thickness distribution of the substrate B1, it is possible to uniform the amount of attenuation of the laser light R on the entire substrate B1 until the laser light R reaches the altered portion K1. Accordingly, even with the thickness distribution of the substrate B1, it is possible to keep constant the transmission rate and distortion amount at the altered portion K1, and it is thus possible to prevent reduction in dimension accuracy and position accuracy of the mask pattern P1.

Alternatively, as illustrated in FIG. 1C, the laser intensity or the laser irradiation time of the laser light R may be changed according to the thickness distribution of the substrate B1 while the height position Ht of the altered portion K1' is kept constant. For example, the laser intensity may be higher or the laser irradiation time may be longer at the position with a distance of Hr1 from the back surface of the substrate B1 to the altered portion K1', than at the position with a distance of Hr2. Thus, even with the thickness distribution of the substrate B1, it is possible to compensate for the amount of attenuation of the laser light R until the laser light R reaches the altered portion K1'. Accordingly, even with the thickness distribution of the substrate B1, it is possible to keep constant the transmission rate and the distortion amount of the altered portion K1', and it is thus possible to prevent reduction in dimension accuracy and position accuracy of the mask pattern P1.

Meanwhile, it is assumed that the pattern transferring plate B is a template for nanoimprint. In this template, a print pattern P2 is formed on the substrate B2 as illustrated in FIG. 1D. The print pattern P2 may be formed by concave portions (or convex portions) provided in the substrate B2. The substrate B2 may be a transparent substrate of quartz, glass, or the like. The laser light R emitted from the laser light source 1 enters the substrate B1 through in sequence the illumination optical system 2, the reflective mirror 3, and the reduced projection optical system 4, thereby to locally form the altered portion K2 within the substrate B2. At that time, when the stage 5 is moved up and down in the z direction according to the thickness distribution of the substrate B2, a height position Ht of the altered portion K2 is controlled in correspondence with the thickness distribution of the substrate B2. At that time, the height position Ht of the altered portion K2 can be set such that a distance Hr from a back surface of the substrate B2 to the altered portion K2 is constant. Thus, even with the thickness distribution of the substrate B2, it is possible to uniform the amount of attenuation of the laser light R on the entire substrate B1 until the laser light R reaches the altered portion K2. Accordingly, even with the thickness distribution of the substrate B2, it is possible to keep constant the transmission rate and distortion amount at the altered portion K2, and it is thus possible to prevent reduction in dimension accuracy and position accuracy of the print pattern P2.

Alternatively, as illustrated in FIG. 1E, the laser intensity or the laser irradiation time of the laser light R may be changed according to the thickness distribution of the substrate B2 while the height position Ht of the altered portion K2' is kept constant. For example, the laser intensity may be higher or the laser irradiation time may be longer at the position with a distance of Hr1 from the back surface of the substrate B2 to the altered portion K2', than at the position with a distance of Hr2. Thus, even with the thickness distribution of the substrate B2, it is possible to compensate for the amount of attenuation of the laser light R until the laser light R reaches the altered portion K2'. Accordingly, even with the thickness distribution of the substrate B2, it is possible to keep constant the transmission rate and the distortion amount of the altered portion K2', and it is thus possible to prevent reduction in dimension accuracy and position accuracy of the mask pattern P2.

Hereafter, descriptions will be given as to a calculating method of offset distribution L (X, Y) of the stage or laser light source height to meet a processed height distribution (glass center height distribution of mask) Hfq (X, Y).

Figure 5:
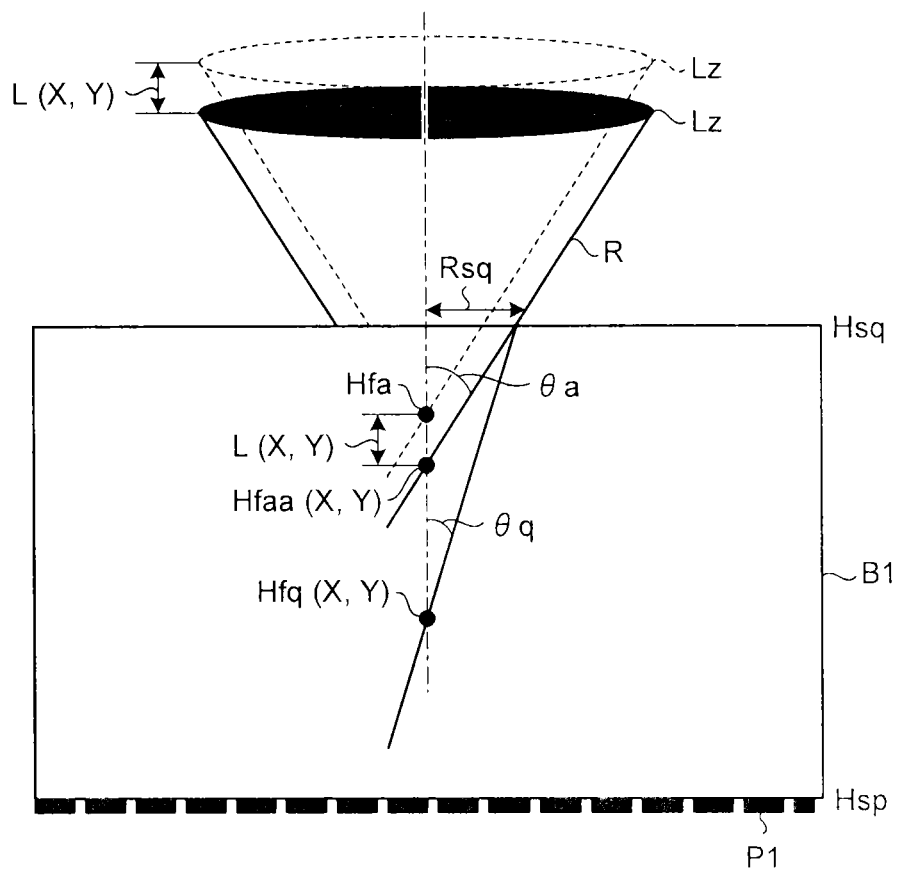
FIG. 5 is a schematic cross-sectional view of a light path during laser application.

FIG. 5 is a schematic cross-sectional view of a light path during laser application.

Referring to FIG. 5, when it is assumed that the thickness distribution of the substrate is designated as Th (X, Y), a pattern surface height distribution as Hsp (X, Y), and substrate back surface height distribution as Hsq (X, Y), at least two of Th (X, Y), Hsp (X, Y), and Hsq (X, Y) are measured. They are in the following relationship:

$$Th(X,Y) = Hsp(X,Y) - Hsq(X,Y) \quad (1)$$

From the measurement result, the processed height distribution Hfq (X, Y) can be expressed by the following equation:

$$Hfq(X,Y) = (Hsp(X,Y) + Hsq(X,Y))/2 \quad (2)$$

In the foregoing equation, Th (X, Y) denotes a distance between a first main surface of the substrate on which a pattern is formed and a second main surface on the other side of the substrate on which no pattern is formed, Hsp (X,Y) denotes the height of the first main surface in a coordinate system defined on the device, and Hsq (X, Y) denotes the height of the second main surface of the substrate in a coordinate system defined on the device. They may be measured at the laser application machine or may be measured using a separate device. However, Hsp (X, Y) and Hsq (X, Y) are preferably obtained by actually measuring postures on the stage 5 of the laser application machine. These distributions are results of measurement at 25 points (5×5) in a plane of the substrate, and thus preferably, values between the measurement points are approximated or interpolated by the use of a method typified by Thin-Plate-Spline, Triangle Interpolation, or the like.

Next, the offset distribution L (X, Y) is calculated from the processed height distribution Hfq (X, Y).

The laser light R narrowed by an object lens Lz is irradiated from the air Air to glass Qz as a process target. Here, it is assumed that an effective laser focus height in the air Air after the offset is designated as Hfaa (X, Y), a focus position within the glass as Hfq (X, Y), incident angle as θa, refraction angle as θq, and radius of incident light in a boundary surface between the air and the glass as Rsq (X, Y).

The offset distribution L (X, Y) can be expressed by the following equation using Hfa determined at the focus position adjustment unit 9A:

$$L(X,Y) = Hfa - Hfaa(X,Y) \quad (3)$$

Here, Hfaa (X, Y) can be expressed by the following equation:

$$Hfaa(X,Y) = Hsq(X,Y) - Rsq(X,Y) \cdot \tan(90° - \theta a) \quad (4)$$

Here, Hsq is known from equation (2) and θa is known from a designed value, and thus only Rsq (X, Y) needs to be determined.

To meet the processed height distribution Hfq (X, Y) in equation (2), Rsq (X, Y) needs to satisfy the following equation:

$$Rsq(X,Y) = (Hsq(X,Y) - Hfq(X,Y)) \cdot \tan \theta q \quad (5)$$

Here, the refraction angle θq is expressed by the following equation from a refractive index na of the air and a refractive index nq of the glass:

$$\theta q = a\sin((na/nq) \cdot \sin \theta a) \quad (6)$$

Accordingly, the offset distribution L (X, Y) can be determined from equations (3) to (6).

Described above is a calculating method of a focus height offset distribution taking into account the refraction of the laser light R on the glass boundary surface. The present invention is not limited to this calculating method but may use other calculation methods. For example, the focus height offset distribution may be calculated using a difference between an optical focus position and an actual processing position. The laser parameter is not limited to focus height but may be calculated as an energy distribution of laser.

FIG. 6 is a flowchart of an adjusting method of a pattern transferring plate according to the first embodiment.

Referring to FIG. 6, the laser application machine measures the focus position of the laser light R (S1). Then, the laser application machine reads the thickness distribution of the pattern transferring plate B (S2). The laser application machine then calculates an ideal focus position from the refractive index of a material for the pattern transferring plate B (S3). The laser application machine then processes the pattern transferring plate B while adjusting the parameter for laser irradiation (S4). At that time, the laser application machine can form the altered portion K within the pattern transferring plate B while controlling the focus height of laser irradiation, laser intensity, or laser irradiation time in correspondence with the thickness distribution of the substrate of the pattern transferring plate B.

Described above in relation to the foregoing embodiment is a controlling method of the laser intensive or laser irradiation time of the laser light R to compensate for the amount of attenuation of the laser light R corresponding to the thickness distribution of the substrate. Alternatively, an auxiliary plate made of the same material as that for the substrate may be inserted in the light path of the laser light R in correspondence with the thickness distribution of the substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An adjusting method of a pattern transferring plate, comprising:
   adjusting a parameter for laser irradiation in correspondence with thickness distribution of a substrate of the pattern transferring plate in which a pattern is formed on the substrate to form an altered portion within the substrate, wherein
   a height position of the altered portion is set such that a distance from a back surface of the substrate to the altered portion is constant and a height position of the altered portion is set such that a distance from the front surface of the substrate to the altered portion is different in correspondence with thickness distribution of the substrate to keep constant a transmission rate and a distortion amount of the altered portion by moving the pattern transferring plate up and down when laser light is emitted to the pattern transferring plate,
   or a height position of the altered portion is set such that a distance from the front surface of the substrate to the altered portion is constant and a height position of the altered portion is set such that a distance from the back surface of the substrate to the altered portion is different in correspondence with thickness distribution of the substrate to keep constant a transmission rate and a distortion amount of the altered portion by changing laser intensity or laser irradiation time.

2. The adjusting method of a pattern transferring plate according to claim 1, further comprising measuring a focus position of the laser.

3. The adjusting method of a pattern transferring plate according to claim 1, wherein the parameter for laser irradiation is focus height.

4. The adjusting method of a pattern transferring plate according to claim 1, wherein the parameter for laser irradiation is laser intensity or laser irradiation time.

5. The adjusting method of a pattern transferring plate according to claim 1, comprising controlling the laser intensity such that the amount of attenuation by the substrate is unified according to the thickness distribution of the substrate.

6. The adjusting method of a pattern transferring plate according to claim 1, wherein the pattern transferring plate is a photomask.

7. The adjusting method of a pattern transferring plate according to claim 1, wherein the pattern transferring plate is a template for nanoimprint.

8. A laser application machine, comprising:
   a stage that holds a pattern transferring plate in which a pattern is formed on a substrate;
   a laser light source that generates laser light to be irradiated to the pattern transferring plate to form an altered portion within the substrate;
   a parameter adjustment unit that adjusts a parameter for laser irradiation in correspondence with thickness distribution of the substrate; and
   a laser control unit that controls laser irradiation within the substrate based on the parameter, wherein
   a height position of the altered portion is set such that a distance from a back surface of the substrate to the altered portion is constant and a height position of the altered portion is set such that a distance from the front surface of the substrate to the altered portion is different in correspondence with thickness distribution of the substrate to keep constant a transmission rate and a distortion amount of the altered portion by moving the stage up and down when laser light is emitted to the pattern transferring plate,
   or a height position of the altered portion is set such that a distance from the front surface of the substrate to the altered portion is constant and a height position of the altered portion is set such that a distance from the back surface of the substrate to the altered portion is different in correspondence with thickness distribution of the substrate to keep constant a transmission rate and a distortion amount of the altered portion by changing laser intensity or laser irradiation time.

9. The laser application machine according to claim 8, further comprising a focus position adjustment unit that adjusts a focus position of the laser.

10. The laser application machine according to claim 9, further comprising:
    an opening provided in the stage; and
    a light-receiving unit that receives the laser light through the opening.

11. The laser application machine according to claim 10, wherein the focus position adjustment unit adjusts the focus position of the laser light such that the intensity of the laser light received by the light-receiving unit is a maximum.

12. The laser application machine according to claim 8, further comprising:
    a stage drive unit that moves the stage in a horizontal direction and a height direction; and
    a stage control unit that controls height of the stage based on the parameter.

13. The laser application machine according to claim 8, wherein the parameter for laser irradiation is focus height.

14. The laser application machine according to claim 8, wherein the parameter for laser irradiation is laser intensity or laser irradiation time.

15. The laser application machine according to claim 8, wherein the laser intensity is controlled such that the amount of attenuation by the substrate is unified according to the thickness distribution of the substrate.

16. The laser application machine according to claim 8, wherein the pattern transferring plate is a photomask.

17. The laser application machine according to claim 8, wherein the pattern transferring plate is a template for nanoimprint.

18. A pattern transferring plate, comprising:
    a substrate;
    a pattern formed on a front surface of the substrate; and an altered portion in which height distribution within the substrate is set in correspondence with thickness distribution of the substrate, wherein a height position of the altered portion is set such that a distance from a back surface of the substrate to the altered portion is constant and a height position of the altered portion is set such that a distance from the front surface of the substrate to the altered portion is different in correspondence with thickness distribution of the substrate to keep constant a transmission rate and a distortion amount of the altered portion, or a height position of the altered portion is set such that a distance from the front surface of the substrate to the altered portion is constant and a height position of the altered portion is set such that a distance from the back surface of the substrate to the altered portion is different in correspondence with thickness distribution of the substrate to keep constant a transmission rate and a distortion amount of the altered portion.

19. The pattern transferring plate according to claim 18, wherein the pattern transferring plate is a photomask.

20. The pattern transferring plate according to claim 18, wherein the pattern transferring plate is a template for nanoimprint.

\* \* \* \* \*